US008063805B1

(12) United States Patent
Eid

(10) Patent No.: US 8,063,805 B1
(45) Date of Patent: Nov. 22, 2011

(54) DIGITAL FEEDBACK TECHNIQUE FOR REGULATORS

(75) Inventor: Sherif Eid, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 6 days.

(21) Appl. No.: 12/621,311

(22) Filed: Nov. 18, 2009

Related U.S. Application Data

(60) Provisional application No. 61/115,540, filed on Nov. 18, 2008.

(51) Int. Cl.
*H03M 1/00* (2006.01)

(52) U.S. Cl. ........................................ 341/142; 341/144

(58) Field of Classification Search .................. 341/144, 341/145, 142; 369/44.28
See application file for complete search history.

(56) References Cited

U.S. PATENT DOCUMENTS

| | | | | |
|---|---|---|---|---|
| 7,013,183 | B1 * | 3/2006 | Solomon | 700/11 |
| 7,158,841 | B1 * | 1/2007 | Myers et al. | 700/28 |
| 2007/0280061 | A1 * | 12/2007 | Lan et al. | 369/44.28 |

* cited by examiner

*Primary Examiner* — Jean Jeanglaude

(57) ABSTRACT

A voltage regulator uses a digital feedback technique to regulate the voltage at an output of the regulator. The voltage level of an output signal is measured. The voltage level of the output signal is compared to a first reference voltage. A programmable digital control logic block regulates the voltage level of the output signal and operates in a first mode if the voltage level of the output signal is above a first reference voltage and in a second mode if the voltage level of the output signal is below the first reference voltage. Depending on the mode of operation, the programmable digital control logic block provides digital control signals to other elements of the feedback loop.

21 Claims, 6 Drawing Sheets

DIGITAL FEEDBACK TECHNIQUE FOR REGULATORS

RELATED APPLICATIONS

This application claims the benefit of U.S. Provisional Application No. 61/115,540 filed on Nov. 18, 2008.

TECHNICAL FIELD

This disclosure relates generally to voltage regulators and, in particular, to a digital feedback technique for voltage regulators.

BACKGROUND

Voltage regulator circuits can serve numerous purposes in integrated circuit devices. Voltage regulators can be utilized to provide a controlled voltage or current to a load in accordance with desired regulation characteristics. Another application can be to regulate an internal power supply voltage for certain sections of an integrated circuit device. In one particular application, voltage regulators can supply a power supply voltage to memory cell arrays within memory devices, such as, for example, static random access memories (SRAMs), among many other possible applications.

BRIEF DESCRIPTION OF THE DRAWINGS

The present disclosure is illustrated by way of example, and not by way of limitation, in the figures of the accompanying drawings.

DETAILED DESCRIPTION

The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Embodiments of a method and apparatus are described to regulate a voltage using a digital feedback technique. In one embodiment, the voltage level of an output signal at an output node of a feedback loop is measured. The voltage level of the output signal is compared to a first reference voltage. A digital control logic block regulates the voltage level of the output signal and operates in a first mode if the voltage level of the output signal is above a first reference voltage, and in a second mode if the voltage level of the output signal is below the first reference voltage. Depending on the mode of operation, the digital control logic block provides digital control signals to other elements of the feedback loop.

Figure 1:
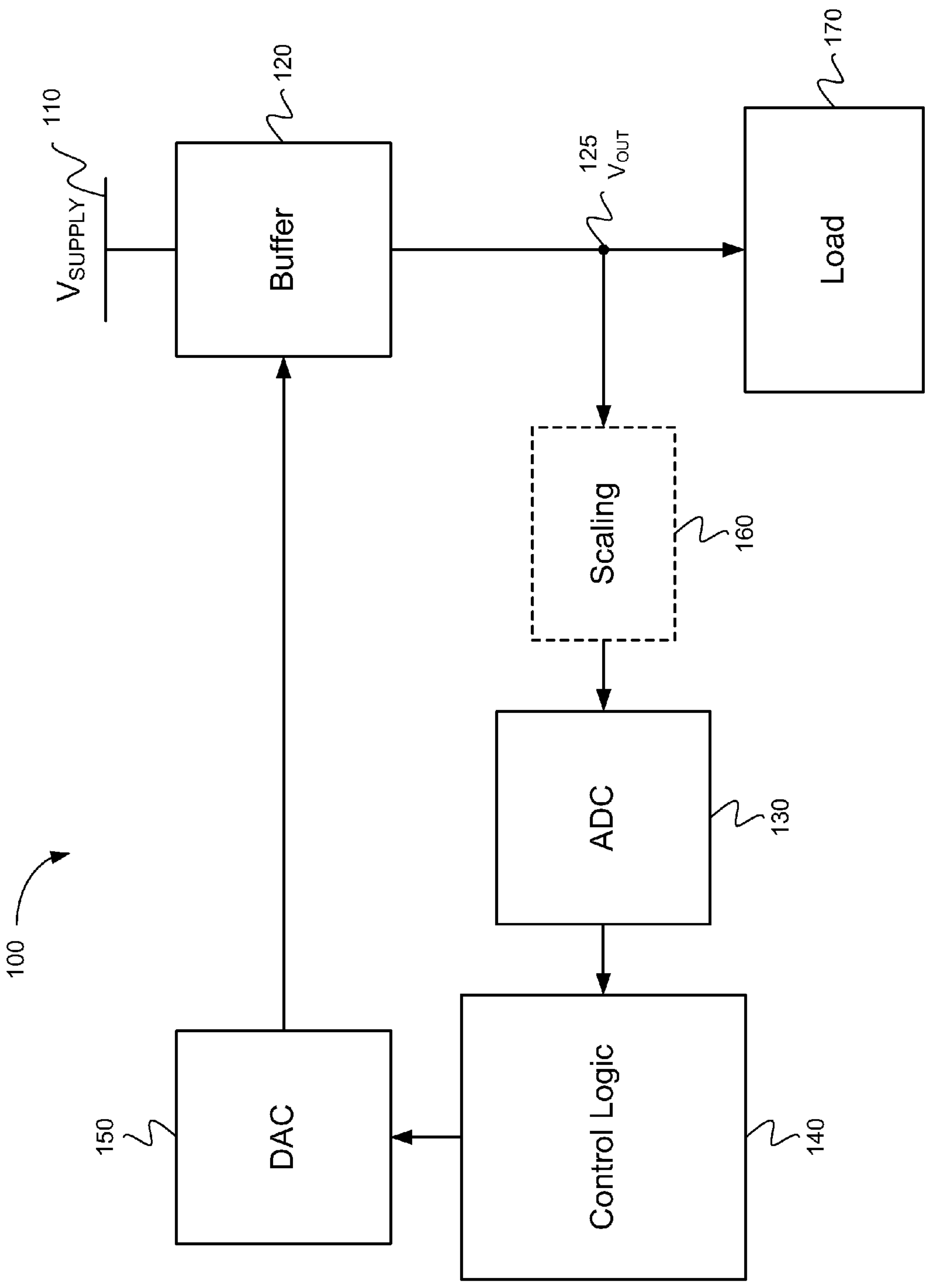
FIG. 1 is a block diagram illustrating a voltage regulator circuit implementing a digital feedback technique according to an embodiment.

FIG. 1 is a block diagram illustrating a voltage regulator circuit implementing a digital feedback technique according to an embodiment. In one embodiment the circuit 100 includes a voltage supply ($V_{SUPPLY}$) 110, buffer device 120, analog-to-digital converter (ADC) 130, control logic 140 and digital-to-analog converter (DAC) 150. The circuit 100 may optionally include scaling circuit 160. The voltage regulator circuit 100 regulates the voltage at output node 125, which is used to drive a load 170.

In one embodiment, the voltage ($V_{OUT}$) at output node 125 is sensed and converted to a digital signal at ADC 130. The voltage $V_{OUT}$ may optionally be scaled at scaling circuit 160. For example, scaling circuit 160 may reduce the output voltage $V_{OUT}$ by one half if ADC 130 operates at a lower voltage than load 170. The digital signal output by ADC 130 is processed by control logic 140 to determine whether $V_{OUT}$ needs to be adjusted based the requirements of load 170. Control logic 140 may further determine one of various modes of operation for the feedback loop.

Control logic 140 provides a digital control signal to DAC 150, where the digital control signal is converted to an analog signal. The analog signal controls buffer device 120 which adjusts the voltage passed from $V_{SUPPLY}$ 110 to the output node 125. In this manner the output voltage $V_{OUT}$ is regulated with a digital feedback technique.

Figure 2:
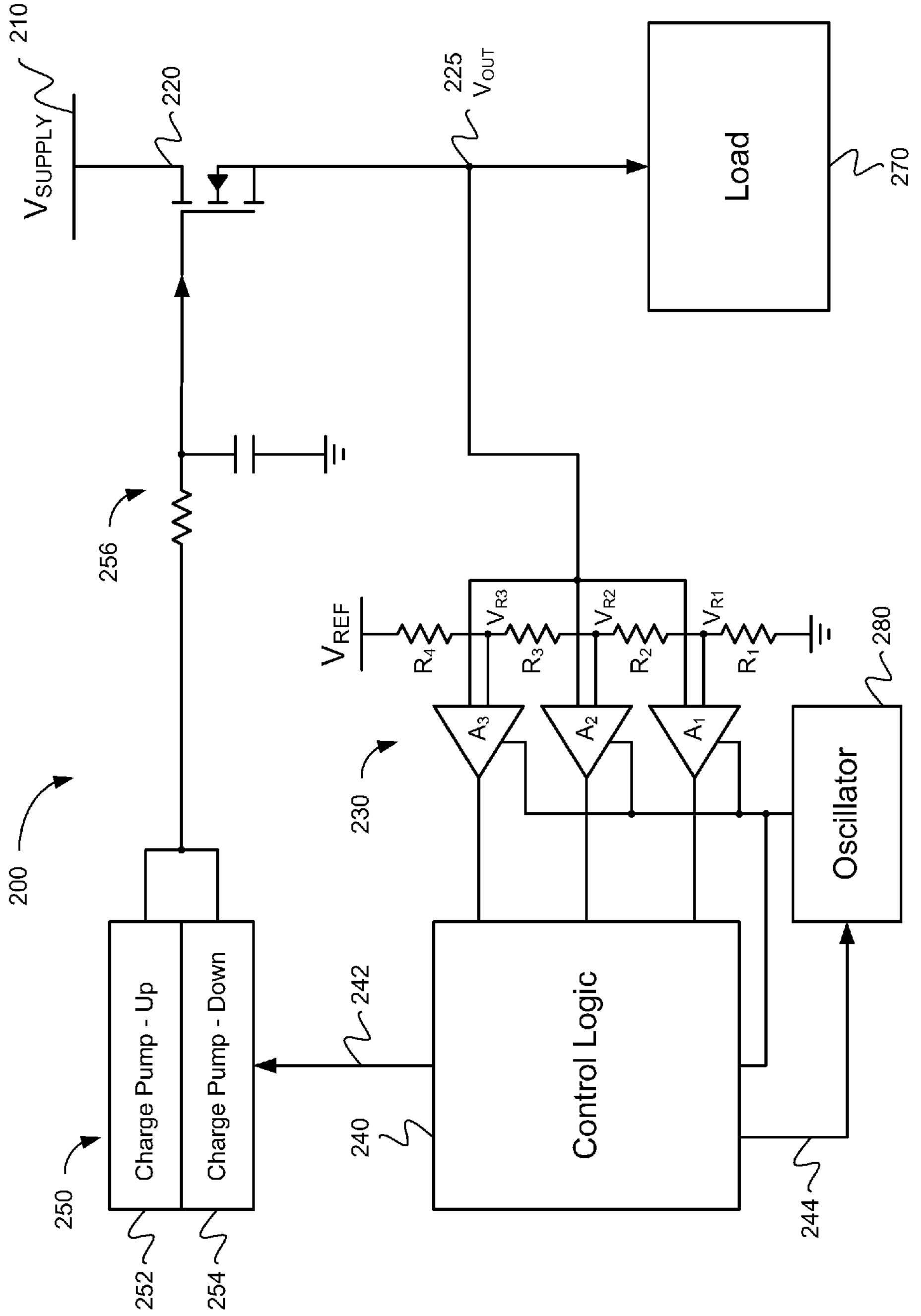
FIG. 2 is a block diagram illustrating a voltage regulator circuit implementing a digital feedback technique according to an embodiment.

FIG. 2 is a block diagram illustrating a voltage regulator circuit implementing a digital feedback technique according to an embodiment. The circuit 200 is a more detailed version of the circuit 100 discussed above with respect to FIG. 1. In one embodiment, the circuit 200 includes supply voltage $V_{SUPPLY}$ 210. Circuit 200 also includes buffer device 220 coupled between the supply voltage 210 and the rest of the circuit. In one embodiment, buffer device 220 includes an N-channel metal-oxide-semiconductor field-effect transistor (MOSFET). In other embodiments, the buffer device 220 may include some other combination of one or more transistor devices. Buffer device 220 may be coupled between $V_{SUPPLY}$ 210 and an output node 225. The voltage $V_{OUT}$ at output node 225 is used to drive a load 270.

The output voltage $V_{OUT}$ is regulated using a digital feedback technique through ADC 230, control logic 240 and DAC 250. The analog voltage signal at output node 225 is coupled, either directly or indirectly, to an input of ADC 230. In one embodiment, ADC 230 is a flash ADC including a reference voltage $V_{REF}$, a voltage divider including resistors $R_1$, $R_2$, $R_3$, and $R_4$, and comparators $A_1$, $A_2$, and $A_3$. The voltage divider divides the reference voltage $V_{REF}$ into a number of successive reference voltages which are each compared to the voltage $V_{OUT}$ sensed at the output node 225. In one embodiment, R4 is coupled to $V_{REF}$, $V_{R3}$ is formed between $R_4$ and $R_3$, $V_{R2}$ is formed between $R_3$ and $R_2$, and $V_{R1}$ is formed between $R_2$ and $R_1$, where $R_1$ is coupled to ground or some other low voltage supply. In this example, three successive reference voltages are formed by the voltage divider, however, in other embodiments, any number of resistors may be used to form any number of successive reference voltages for comparison. In an alternative embodiment capacitors are used to divide $V_{REF}$ into a number of successive reference voltages. Comparator $A_1$ receives $V_{R1}$ and $V_{OUT}$ as inputs, and outputs a high digital signal if $V_{OUT}$ has a magnitude greater than $V_{R1}$. Similarly, $A_2$ compares $V_{R2}$ and $V_{OUT}$ and $A_3$ compares $V_{R3}$ and $V_{OUT}$. In one embodiment, comparators $A_1$, $A_2$, and $A_3$ are formed by operational amplifiers. In another embodiment, the output of the comparators is high when the respective reference voltage is greater than $V_{OUT}$. The output signals of comparators $A_1$, $A_2$, and $A_3$ are provided to control logic 240.

Figure 3A:
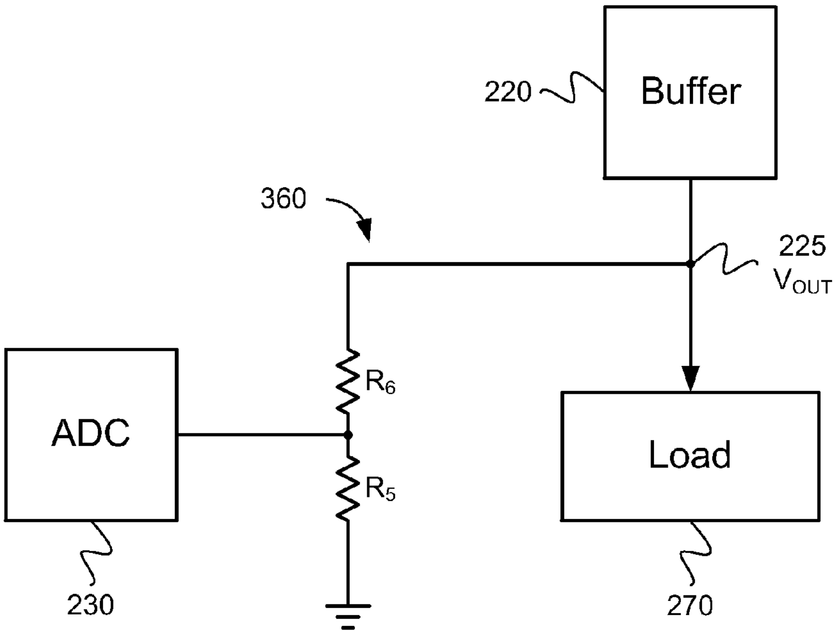
FIGS. 3A and 3B are block diagrams illustrating scaling circuits for use in a voltage regulator circuit implementing a digital feedback technique according to an embodiment.

In one embodiment, illustrated in FIG. 3A, before the output voltage $V_{OUT}$ is sensed by ADC 230, the voltage $V_{OUT}$ is scaled by scaling circuit 360. Scaling circuit 360 may include a voltage divider formed, for example, by resistors $R_5$ and $R_6$. In one embodiment, where the output voltage $V_{OUT}$ is 1.2 V, for example, $V_{OUT}$ may be decreased by one half (i.e., to 0.6 V) by scaling circuit 360. In such a case $R_5$ and $R_6$ have equal resistance values. The values of $R_5$ and $R_6$ can be adjusted to scale the output voltage $V_{OUT}$ to any fraction of the original output voltage. In one embodiment, the scaling circuit 360 is coupled between $V_{OUT}$ and ground, however, in alternative embodiments, scaling circuit 360 may be coupled between $V_{OUT}$ and some other voltage node. In other embodiments, scaling circuit 360 can be a resistor network having some other form.

Figure 3B:
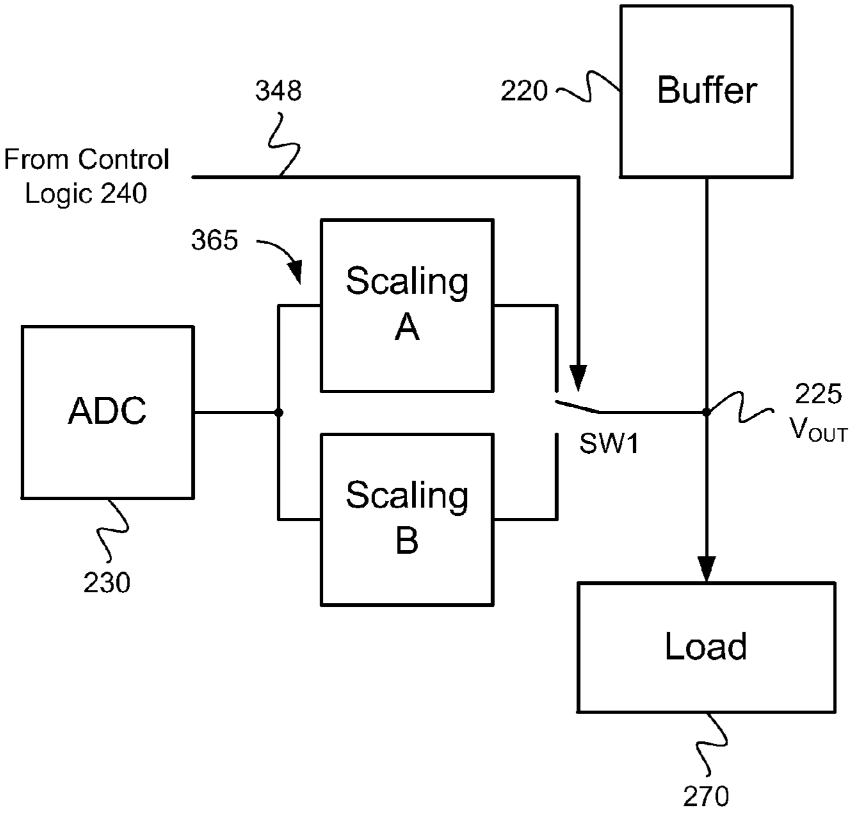

In another embodiment, illustrated in FIG. 3B, scaling circuit 365 may include a plurality of scaling circuits. In this example, two separate scaling circuits, Scaling A and Scaling B, are shown, however, any number of scaling circuits may be used. The scaling circuits are coupled to output node 125 through a switch SW1. SW1 is controlled by a control signal 348 from control logic 240. In one embodiment, Scaling A may be a high resistance branch, which is enabled by the control signal when the regulator is configured for low power operation. Scaling B may be a low resistance branch, enabled when the regulator is configured for high speed operation. In one embodiment, all scaling circuits (e.g., Scaling A and Scaling B) have the same scaling ratio (e.g. 1:0.5), but may have different properties, such as for example, different impedance values. The control signal 348 provided by control logic 240 can select the appropriate scaling circuit based on a mode of operation.

Referring again to FIG. 2, regulator circuit 200 further includes control logic 240. In one embodiment, control logic 240 is a pure digital logic circuit configured to control the feedback loop. Control logic 240 may include a microcontroller, a custom logic implementation, a series of look-up tables, register transfer level (RTL), synthesizable logic or some other form of digital logic. The digital nature of control logic 240 makes it easily programmable to adapt to the specific implementation in which the regulator circuit 200 is applied.

In one embodiment, control logic 240 receives the digital signals from ADC 230 indicating the relation between the output voltage $V_{OUT}$ (either scaled or unscaled) and the series of successive reference voltages $V_{R1}$, $V_{R2}$, and $V_{R3}$. The resulting signals from comparators A1, A2 and A3 indicate the range of output voltage $V_{OUT}$. The signals are used by control logic 240 to generate one or more digital control signals to control certain characteristics of elements of the feedback loop. One example of the digital control signals generated by control logic 240 is control signal 242. Control signal 242 is applied to ADC 250 which provides a signal to control buffer device 220. Control signal 242 indicates whether the voltage provided through buffer device 220 to output node 225 should be increased or decreased. Control logic 240 can be programmed with the desired target voltage for the output node 225 and can generate control signal 242 based on a comparison of the target voltage to the actual voltage $V_{OUT}$. Control logic 240 can be programmed to operate in a number of different modes, such as a high speed mode or a low power mode. In a high speed mode, control logic 240 may configure regulator 200 to supply a higher output capacitive or current load to drive load 270. In a low power mode, control 240 may configure regulator 200 to supply a lower output capacitive or current load to drive load 270. ADC 250 responds to control signal 242 by appropriately adjusting the analog signal which controls buffer device 220.

In one embodiment ADC 250 may include one or more charge pumps 252, 254. Charge pumps 252, 254 are controlled by the digital control signal 242 from control logic 240. When control logic 240 determines that the output voltage $V_{OUT}$ needs to be increased, charge pump 252 is activated. The output of charge pump 252 is applied to a gate terminal of buffer device 220. The increased output of the charge pump 252 causes buffer device 220 to allow a higher percentage of $V_{SUPPLY}$ 210 through the buffer device 220, thereby increasing the voltage $V_{OUT}$ at output node 225. When control logic 240 determines that the output voltage $V_{OUT}$ needs to be decreased, charge pump 254 is activated. The output of charge pump 254 is applied to a gate terminal of buffer device 220. The decreased output of the charge pump 254 causes buffer device 220 to allow a low percentage of $V_{SUPPLY}$ 210 through the buffer device 220, thereby decreasing the voltage $V_{OUT}$ at output node 225.

The output of charge pumps 252, 254 may optionally be passed through filter circuit 256. Filter circuit 256 may be coupled between charge pumps 252, 254 and the gate terminal of buffer device 220. In one embodiment, filter circuit 256 is a resistor-capacitor (RC) filter, however, in other embodiments some other filter type may be used.

Control logic 240 allows the regulator circuit 200 to operate in a number of different modes. The different modes may be, for example, a high speed mode, a low power mode, an accelerated mode, a normal speed mode, or any number of other intermediate modes. Control logic 240 may determine the mode of operation for the circuit 200 in a number of ways. In one embodiment, the successive reference voltages $V_{R1}$, $V_{R2}$, and $V_{R3}$ in ADC 230 act as thresholds for different modes of operation. For example if the measured voltage $V_{OUT}$ is beyond a certain threshold away from the target output voltage, control logic 240 may operate the regulator in an accelerated mode in order to more quickly converge on the target voltage. Once the measured voltage $V_{OUT}$ crosses the threshold, control logic 240 may switch the regulator to normal speed mode to achieve greater accuracy as the measured voltage approaches the target voltage.

Figure 4:
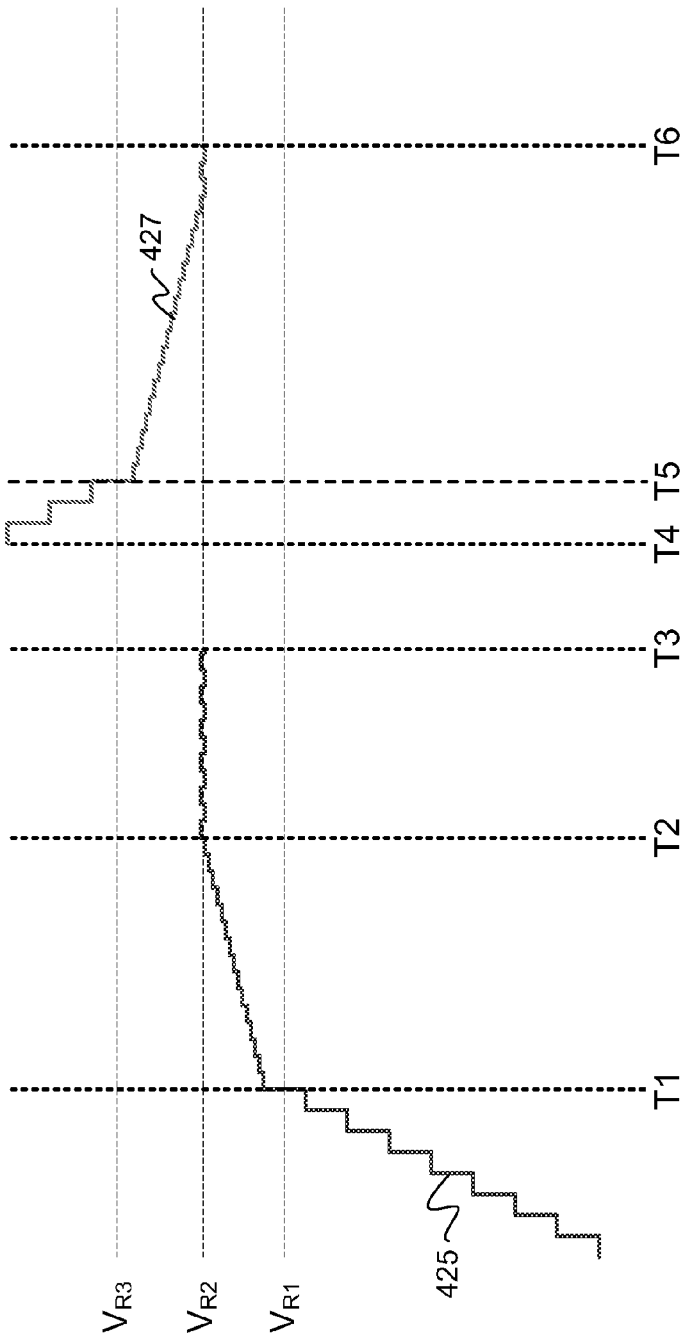
FIG. 4 is a timing diagram illustrating output voltage levels in a voltage regulator circuit implementing a digital feedback technique according to an embodiment.

FIG. 4 is a timing diagram illustrating output voltage levels in a voltage regulator circuit implementing a digital feedback technique according to an embodiment. The voltages 425 and 427 represent the output voltage of regulator circuit, such as circuit 200 in FIG. 2. Voltage 425 may be measured and compared to one or more reference voltages (e.g., $V_{R1}$, $V_{R2}$, and $V_{R3}$) by an analog-to-digital converter, such as ADC 230, where the results are provided to control logic 240. In one embodiment, $V_{R2}$ may represent the target voltage for the regulator. If control logic 240 determines that voltage 425 is below a first threshold voltage $V_{R1}$, control logic 240 may configure the regulator to operate in an accelerated mode. In the accelerated mode, the voltage 425 will be increased at a quicker rate in order to reach the target voltage $V_{R2}$ sooner. At T1, control logic 240 determines that voltage 425 has reached the threshold voltage $V_{R1}$, which is at a voltage level less than the target voltage $V_{R2}$. In one embodiment, the target voltage $V_{R2}$ may be for example, 1.2 V and the first threshold voltage $V_{R1}$ may be 1.15 V. At T1, control logic 240 switches the regulator to operate in a normal speed mode, since voltage 425 is between $V_{R1}$ and $V_{R2}$. In the normal speed mode, the voltage 425 is increased at a slower rate in order to provide more accuracy as the measured voltage approaches the target voltage. Between T2 and T3, voltage 425 is approximately equal to the target voltage $V_{R2}$. Control logic maintains the normal speed mode to compensate for minor variations in voltage 425 which may occur.

In another example, voltage 427 is measured at the output of the voltage regulator circuit beginning at T4. In this example, voltage 427 is greater than the target voltage $V_{R2}$. A second threshold voltage $V_{R3}$ may exist above the target voltage. In one embodiment, the second threshold voltage $V_{R3}$ may be 1.25 V. If control logic 240 determines that voltage 427 is above the second threshold voltage $V_{R3}$, control logic 240 may configure the regulator to operate in the accelerated mode. At T5, control logic 240 determines that voltage 427 has reached the threshold voltage $V_{R3}$. Control logic 240 switches the regulator to operate in the normal speed mode, since voltage 427 is between $V_{R3}$ and $V_{R2}$. Voltage 427 converges with the target voltage at T6.

Referring again to FIG. 2, control logic 240 may also determine whether to change the mode of operation of circuit 200, based on a history stored in control logic 240. In one embodiment, control logic 240 includes a memory to store a number of measurements of the voltage $V_{OUT}$ taken at output node 225. In one embodiment, control logic 240 may examine a predetermined number of past measurements stored in the memory (e.g., the past 10 stored measurements). If, for example, the past 10 stored measurements were all below the target voltage for output node 225, then control logic 240 may switch to an accelerated mode. The 10 most recently stored measurements are continually examined. Once control logic determines that not all of the past 10 stored measurements were below the target voltage, control logic 240 may switch back to a normal speed mode, because the output voltage has reached the target voltage. Control logic may similarly initiate the same modes of operation when the past 10 stored measurements are all above the target voltage. In alternative embodiments, any number of stored measurements may be examined to determine the proper mode of operation.

The mode of operation set by control logic 240 may affect the control signals output by control logic 240 to other components of the feedback loop. For example, when control logic 240 initiates an accelerated mode, control signal 242 may signal charge pumps 252, 254 to either increase or decrease the voltage level in a greater increment for each clock cycle. Similarly, when control logic 240 initiates a normal speed mode, control signal 242 may signal charge pumps 252, 254 to increase or decrease the voltage level in small increment step sizes. In one embodiment, the charge pumps 252, 254, in response to control signal 242, may cause the voltage $V_{OUT}$ to either increase or decrease by a step size of 1 millivolt (mV) per clock cycle in a low power mode and by 10 mV in a high speed mode. In other embodiments, other increment step sizes of voltage change may be used.

Another example of a control signal which may be generated by control logic 240 is control signal 244. Control signal 244 controls the operation of oscillator 280. In one embodiment oscillator 280 provides a clock signal to the comparators of ADC 230. Control signal 244 sets the oscillator to the appropriate speed for the given mode of operation. When control logic 240 initiates an accelerated mode, control signal 244 may increase the frequency of oscillator 280. Similarly, when control logic 240 initiates a normal speed mode, control signal 244 may decrease the frequency of oscillator 280. In one embodiment, a comparison is done every clock cycle (i.e., ADC 230 is a single clock ADC), so if the frequency of oscillator 280 increases, more comparisons and voltage adjustments will be done in a shorter period of time. The amount by which the control signal 244 affects the frequency of oscillator 280 is programmable and may be one of any number of values.

Figure 5:
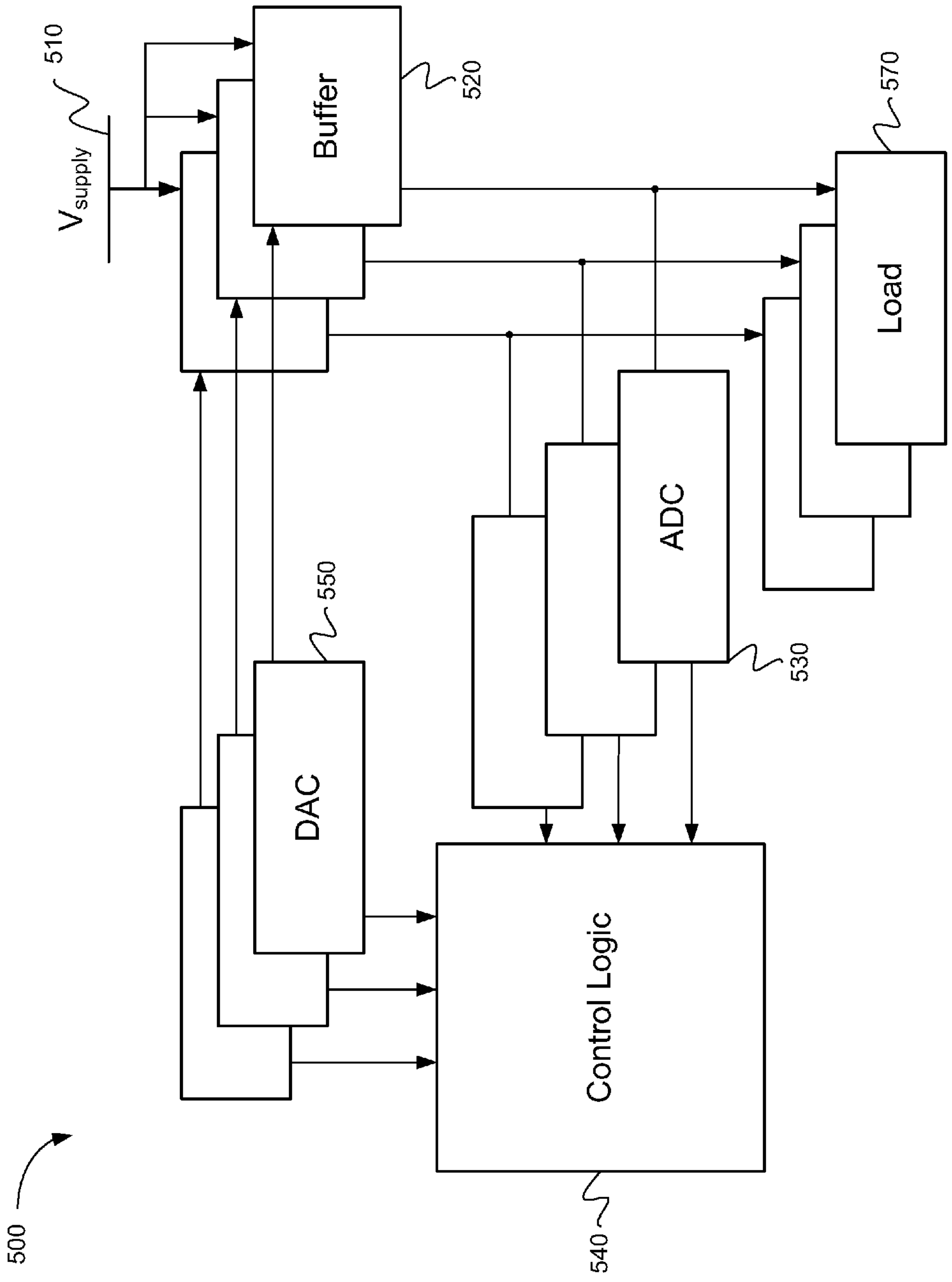
FIG. 5 is a block diagram illustrating multiple feedback loops utilizing a single digital controller according to an embodiment.

FIG. 5 is a block diagram illustrating multiple feedback loops utilizing a single digital controller according to an embodiment. In one embodiment, circuit 500 includes supply voltage 510 which is fed through a buffer device 520 in each feedback loop, the output of each buffer device 520 is fed to an analog-to-digital converter (ADC) 530, and into a single control logic block 540. Control logic 540 outputs a signal to a digital-to-analog converter (DAC) 550 for each feedback loop, which in turn controls the buffer device 520. Each feedback loop in the voltage regulator circuit 500 regulates the voltage used to drive a load 570. Since control logic 540 is a digital logic circuit it can be programmed to control multiple feedback loops at the same time. Control logic 540 can regulate the output voltage for each loop to a different voltage level as well as operate each of the loops in a different mode of operation. In this example, three feedback loops are shown sharing a single control logic block 540, however, in alternative embodiments, any number of feedback loops may share a single control logic block. In one embodiment, control logic 540 may alternately control the multiple feedback loops using, for example, a time slicing method. In other embodiments, control logic 540 may include multiple processing cores to control the multiple feedback loops simultaneously.

Figure 6:
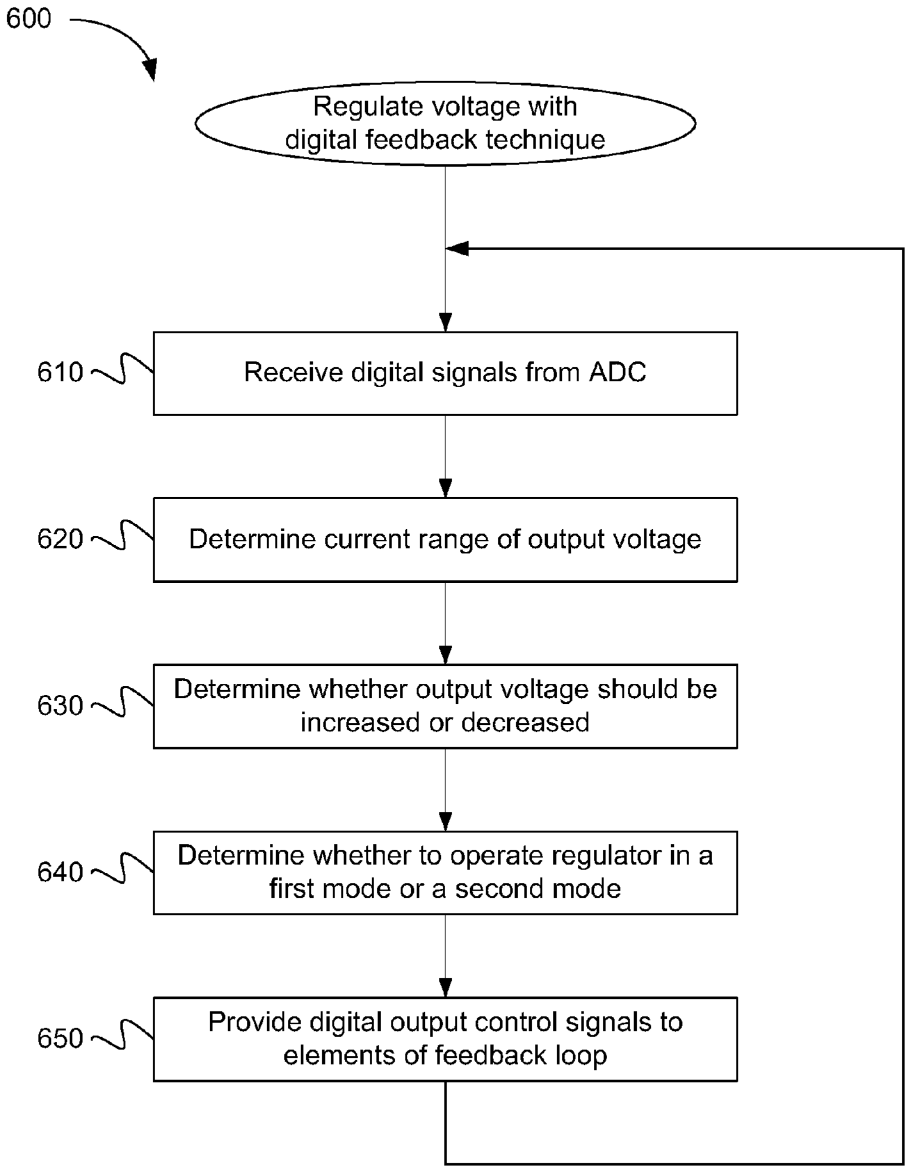
FIG. 6 is a flowchart illustrating a method for regulating voltage with a digital feedback technique according to an embodiment.

FIG. 6 is a flowchart illustrating a method for regulating voltage with a digital feedback technique according to an embodiment. In one embodiment, the method 600 is performed by a digital control logic block, such as control logic 240 of FIG. 2. At block 610, method 600 receives one or more digital signals from an analog-to-digital converter, such as ADC 230 of FIG. 2. In one embodiment, each of the digital signals represents the result of a comparison between a measured output voltage $V_{OUT}$ and a successive reference voltage. At block 620, method 600 determines a current range of the output voltage. The received digital signals each represent whether $V_{OUT}$ is greater than or less than one of the successive reference voltages. By comparing the signals to the known successive reference voltages, control logic 240 determines a range in which the magnitude of $V_{OUT}$ currently falls.

At block 630, method 600 determines whether the output voltage should be increased or decreased. Control logic 240 may be programmed with a desired target voltage which the regulator circuit tries to achieve at the output in order to drive a load. As discussed above, the same control logic block 240 may be used in either a high speed mode, to control a regulator driving a load with high output capacitive or current load, or in a low power mode, to control a regulator driving a load with a low output capacitive or current load. Control logic 240 compares the current output voltage to the target voltage and determines whether to increase or decrease the voltage. At block 640, method 600 determines whether to operate the regulator circuit in one of various modes. The modes may include, for example an accelerated mode and a normal speed mode. In one embodiment, where the measured voltage is beyond a certain magnitude above or below the target voltage, the regulator operates in an accelerated mode to converge on the target voltage more quickly. In one embodiment, where the measured voltage is within a certain magnitude of the target voltage, the regulator operates in a normal speed mode to achieve greater accuracy.

At block 650, method 600 provides one or more digital output control signals to certain elements of the feedback loop. For example, control logic 240 may provide a control signal to a set of charge pumps, where the control signal causes the charge pumps to either pump-up or pump-down the output voltage in a specified increment for each clock cycle. Additionally, control logic may provide a control signal to an oscillator circuit to increase the frequency of a clock signal which controls the circuit elements or a control signal to a switch controlling signal flow to one of several scaling circuits. Since control logic 240 is a pure digital circuit, every parameter (e.g., charge pump scaling, clock frequency, threshold voltages) is programmable and may be tailored to the specific application.

Embodiments of the present invention include various operations described herein. These operations may be performed by hardware components, software, firmware, or a combination thereof. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a machine-readable medium. These instructions may be used to program a general-purpose or special-purpose processor to perform the described operations. A machine-readable medium includes any mechanism for storing or transmitting information in a form (e.g., software, processing application) readable by a machine (e.g., a computer). The machine-readable medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory; or another type of medium suitable for storing electronic instructions.

Additionally, some embodiments may be practiced in distributed computing environments where the machine-readable medium is stored on and/or executed by more than one computer system. In addition, the information transferred between computer systems may either be pulled or pushed across the communication medium connecting the computer systems.

The digital processing devices described herein may include one or more general-purpose processing devices such as a microprocessor or central processing unit, a controller, or the like. Alternatively, the digital processing device may include one or more special-purpose processing devices such as a digital signal processor (DSP), an application specific integrated circuit (ASIC), a field programmable gate array (FPGA), or the like. In an alternative embodiment, for example, the digital processing device may be a network processor having multiple processors including a core unit and multiple microengines. Additionally, the digital processing device may include any combination of general-purpose processing devices and special-purpose processing devices.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

What is claimed is:

1. A method, implemented by a computing device programmed to perform the following, comprising:

measuring a voltage level of an output signal at an output node of a feedback loop;

comparing the voltage level of the output signal to a first reference voltage; and controlling, by the computing device, the voltage level of the output signal using programmable digital control logic based on a result of the comparing, wherein if the voltage level of the output signal is above the first reference voltage, the programmable digital control logic operates in a first mode and if the voltage level of the output signal is below the first reference voltage, the digital control logic operates in a second mode.

2. The method of claim 1, further comprising:

comparing the voltage level of the output signal to a second reference voltage, wherein if the voltage level of the output signal is below the first reference voltage and below the second reference voltage, the digital control logic operates in a third mode.

3. The method of claim 1, further comprising:

converting the output signal to a digital signal.

4. The method of claim 1, further comprising generating a digital control signal, based on a mode of operation, wherein the programmable digital control logic generates the digital control signal to modify characteristics of elements in the feedback loop.

5. The method of claim 4, wherein controlling the voltage level further comprises:

converting the digital control signal to an analog control signal.

6. The method of claim 5, further comprising:

comparing the voltage level of the output signal to a past voltage level of the output signal.

7. The method of claim 6, further comprising:

adjusting the analog control signal based on the comparison of the voltage level of the output signal to the past voltage level of the output signal.

8. The method of claim 7, wherein controlling the voltage level further comprises:

applying the analog control signal to a gate terminal of a buffer device.

9. The method of claim 1, further comprising:

scaling the voltage level of the output signal.

10. An apparatus comprising:

a feedback loop comprising an analog-to-digital converter configured to compare an output voltage level of the feedback loop to a first reference voltage; and a programmable digital control logic block coupled to the feedback loop to control the output voltage level of the feedback loop based on a result of the comparing, wherein if the output voltage level of the feedback loop is above the first reference voltage, the digital control logic block operates in a first mode, and if the output voltage level is below the first reference voltage, the digital control logic block operates in a second mode.

11. The apparatus of claim 10, wherein the feedback loop comprises:

a voltage supply source;

a buffer device coupled to the voltage supply source;

the analog-to-digital converter coupled between the buffer device and the programmable digital control logic block; and a digital-to-analog converter coupled between the programmable digital control logic block and the buffer device.

12. The apparatus of claim 11, wherein the analog-to-digital converter comprises a reference voltage generator and a comparator.

13. The apparatus of claim 12, wherein the reference voltage generator comprises a voltage divider coupled to a reference voltage supply, the voltage divider to divide the reference voltage supply into the first reference voltage.

14. The apparatus of claim 11, wherein the programmable digital control logic block comprises a microcontroller to generate a digital control signal to modify characteristics of elements of the feedback loop.

15. The apparatus of claim 14, wherein the digital control comprises a first digital control signal to select one of a plurality of scaling circuits having different impedance values, a second digital control signal to control an increment step size of the digital-to-analog converter, or a third digital control signal to adjust the frequency of an oscillator.

16. The apparatus of claim 11, wherein the digital-to-analog converter comprises a first charge pump and a second charge pump.

17. The apparatus of claim 11, wherein the feedback loop further comprises a scaling circuit coupled between the buffer device and the analog-to-digital converter.

18. The apparatus of claim 10, wherein the first mode comprises a high speed mode and the second mode comprises a low power mode.

19. An apparatus, comprising:

a first feedback loop comprising an analog-to-digital converter configured to compare a first output voltage level of the first feedback loop to a first reference voltage;

a second feedback loop; and a programmable digital control logic block coupled to the first and second feedback loops to control the first output voltage level of the first feedback loop based on a result of the comparing, wherein if the first output voltage level of the first feedback loop is above a first reference voltage, the programmable digital control logic block operates in a first mode, and if the first output voltage level is below the first reference voltage, the programmable digital control logic block operates in a second mode.

20. The apparatus of claim 19, wherein if a second output voltage level of the second feedback loop is above a second reference voltage, the programmable digital control logic block operates in the first mode, and if the second output voltage level is below the second reference voltage, the programmable digital control logic block operates in the second mode.

21. The apparatus of claim 20, wherein the first mode comprises a high speed mode and the second mode comprises a low power mode.

* * * * *